United States Patent
Song et al.

(10) Patent No.: US 12,342,711 B2
(45) Date of Patent: Jun. 24, 2025

(54) DISPLAY SUBSTRATE AND MASK PLATE ASSEMBLY

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yongjie Song, Beijing (CN); Fengli Ji, Beijing (CN); Chang Luo, Beijing (CN); Jianpeng Wu, Beijing (CN); Yi Ma, Beijing (CN); Xiaoyu Yang, Beijing (CN); Sen Du, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 648 days.

(21) Appl. No.: 17/295,602

(22) PCT Filed: Aug. 18, 2020

(86) PCT No.: PCT/CN2020/109811
§ 371 (c)(1),
(2) Date: May 20, 2021

(87) PCT Pub. No.: WO2021/032087
PCT Pub. Date: Feb. 25, 2021

(65) Prior Publication Data
US 2022/0020829 A1 Jan. 20, 2022

(30) Foreign Application Priority Data
Aug. 19, 2019 (CN) .......................... 201910763581.7

(51) Int. Cl.
*H01L 27/32* (2006.01)
*H10K 50/80* (2023.01)
(Continued)

(52) U.S. Cl.
CPC ........... *H10K 71/166* (2023.02); *H10K 50/80* (2023.02); *H10K 59/122* (2023.02); *H10K 71/00* (2023.02); *H10K 2101/00* (2023.02)

(58) Field of Classification Search
CPC .................................................. H10K 59/122
(Continued)

(56) References Cited

U.S. PATENT DOCUMENTS

| | | | |
|---|---|---|---|
| 7,411,298 B2 * | 8/2008 | Kawakami | ............ H01L 27/124 438/653 |
| 2014/0158046 A1 * | 6/2014 | Kim | ...................... C23C 16/042 118/505 |

(Continued)

FOREIGN PATENT DOCUMENTS

| | | |
|---|---|---|
| CN | 105116687 A | 12/2015 |
| CN | 107946479 A | 4/2018 |

(Continued)

*Primary Examiner* — Dzung Tran
(74) *Attorney, Agent, or Firm* — The Webb Law Firm

(57) ABSTRACT

A display substrate and a mask plate assembly includes a base substrate, a pixel defining layer, a functional layer, a cathode layer, and a covering layer that are sequentially stacked in a direction away from the base substrate, wherein the size of orthographic projection of the functional layer on the base substrate is jointly determined by the size of a display area and a first minimum distance. The first minimum distance is the minimum distance in a direction from the display area to a non-display area and between the boundary of the display area and the boundary of the functional layer, and is determined by a first shadow width of the functional layer extending from the display area to the non-display area. The first shadow width is the maximum (Continued)

width of a shadow area formed within a preset region when the functional layer is vapor deposited in the preset region.

8 Claims, 8 Drawing Sheets

(51) Int. Cl.
  *H10K 59/122* (2023.01)
  *H10K 71/00* (2023.01)
  *H10K 71/16* (2023.01)
  *H10K 101/00* (2023.01)
(58) Field of Classification Search
  USPC .......................................................... 257/40
  See application file for complete search history.

(56) References Cited

U.S. PATENT DOCUMENTS

| | | | |
|---|---|---|---|
| 2016/0348233 A1* | 12/2016 | Ha | H01J 37/32715 |
| 2017/0348962 A1 | 12/2017 | Xiao | |
| 2019/0131528 A1 | 5/2019 | Donoghue et al. | |
| 2019/0252469 A1* | 8/2019 | Xiao | H10K 59/122 |
| 2020/0058906 A1* | 2/2020 | Kim | H10K 71/00 |
| 2020/0075899 A1* | 3/2020 | Kim | H10K 71/166 |
| 2021/0222291 A1 | 7/2021 | Huang et al. | |
| 2022/0020928 A1* | 1/2022 | Du | H10K 71/00 |

FOREIGN PATENT DOCUMENTS

| | | | |
|---|---|---|---|
| CN | 207781607 U | 8/2018 | |
| CN | 109219897 A | 1/2019 | |
| CN | 110055498 A | 7/2019 | |
| WO | 2007040465 A1 | 4/2007 | |

\* cited by examiner

DISPLAY SUBSTRATE AND MASK PLATE ASSEMBLY

CROSS-REFERENCE TO RELATED APPLICATIONS

The present application is a U.S. National Stage Application under 35 U.S.C. § 371 of International Patent Application No. PCT/CN2020/109811, filed on Aug. 18, 2020, which is based on and claims priority from CN application No. 201910763581.7, filed on Aug. 19, 2019, the disclosures of both of which are hereby incorporated into this disclosure by reference in their entirety.

TECHNICAL FIELD

The disclosure relates to the field of display technologies, and in particular relates to a display substrate and a mask plate assembly.

BACKGROUND

In a process for manufacturing an OLED (Organic Light-Emitting Diode), an opening having a preset size is provided in a mask plate, and a related material is evaporated in an opening area of the mask plate to form an OLED device.

SUMMARY

According to a first aspect of an embodiment of the present disclosure, there is provided a display substrate comprising: a base substrate; and a pixel defining layer, a functional layer, a cathode layer and a covering layer which are sequentially stacked in a direction away from the base substrate, wherein a size of the orthographic projection of the functional layer on the base substrate is determined by a size of a display area and a first minimum distance, the first minimum distance is a minimum distance between a boundary of the display area and a boundary of the functional layer in a direction from the display area to a non-display area and is determined by a first shadow width of the functional layer extending from the display area to the non-display area, and the of the first shadow width is a maximum value of a width of a shadow area formed in a preset area under a condition that the functional layer is evaporated in the preset area.

In some embodiments, the first minimum distance is determined by a formula $d=\sqrt{a^2+b^2}+c$, a is an alignment accuracy, b is a position accuracy of a mask plate, c is the first shadow width, and d is the first minimum distance.

In some embodiments, the functional layer is a hole transport layer.

In some embodiments, a size of an orthogonal projection of the pixel defining layer on the base substrate is determined by the size of the display area, the first minimum distance and a second minimum distance, the second minimum distance is a minimum distance between the boundary of the functional layer and a boundary of the pixel defining layer in a direction from the display area to the non-display area and is determined by a second shadow width of the functional layer, the pixel defining layer extends from the display area to the non-display area, and the second shadow width is a maximum value of a width of a shadow area formed outside the preset area under a condition that the functional layer is evaporated within the preset area.

In some embodiments, the second minimum distance is determined by a formula $f=\sqrt{a^2+b^2}+e$, a is an alignment accuracy, b is a position accuracy of a mask plate, e is the second shadow width, and f is the second minimum distance.

In some embodiments, a size of an orthographic projection of the cathode layer on the base substrate is determined by the size of the display area, the first minimum distance, the second minimum distance and a third minimum distance, the third minimum distance is a minimum distance between the boundary of the pixel defining layer and a boundary of the cathode layer in a direction from the display area to the non-display area and is determined by a preset minimum cathode lap width and a third shadow width of the cathode layer, the cathode layer extends from the display area to the non-display area, and the of the third shadow width is a minimum width of a shadow area formed outside the preset area under a condition that the cathode layer is evaporated in the preset area.

In some embodiments, the third minimum distance is positively correlated with a first difference, the first difference is a difference between the preset minimum cathode lap width and the third shadow width.

In some embodiments, the third minimum distance is determined by a formula $i=\sqrt{a^2+b^2}+g-h$, a is an alignment accuracy, b is a position accuracy of a mask plate, g is the preset minimum cathode lap width, h is the third shadow width, and i is the third minimum distance.

In some embodiments, a size of an orthographic projection of the covering layer on the base substrate is determined by the size of the display area, the first minimum distance, the second minimum distance, the third minimum distance and a fourth minimum distance, the fourth minimum distance is a minimum distance between the boundary of the cathode layer and a boundary of the covering layer in a direction from the display area to the non-display area and is determined by a fourth shadow width of the cathode layer and a fifth shadow width of the covering layer, the fourth shadow width is a maximum value of a width of a shadow area formed outside a preset area under a condition that the cathode layer is evaporated in the preset area, the covering layer extends from the display area to the non-display area, and the fifth shadow width is the minimum width of the shadow area formed outside the preset area under a condition that the covering layer is evaporated in the preset area.

In some embodiments, the fourth minimum distance is positively correlated with a second difference, the second difference is a difference between the fourth shadow width and the fifth shadow width.

In some embodiments, the fourth minimum distance is determined by a formula $m=\sqrt{2a^2+2b^2}+j-k$, a is an alignment accuracy, b is a position accuracy of a mask plate, j is the fourth shadow width, k is the fifth shadow width, and m is the fourth minimum distance.

According to a second aspect of the embodiments of the present disclosure, there is provided a mask plate assembly for forming a display substrate which comprises a base substrate, and a pixel defining layer, a functional layer, a cathode layer and a covering layer which are sequentially stacked in a direction away from the base substrate. The mask plate assembly comprises: a first mask plate for forming a functional layer, wherein a size of an opening of the first mask plate is determined by a size of a display area and a first minimum distance, the first minimum distance is a minimum distance between a boundary of the display area and a boundary of the functional layer in a direction from the display area to a non-display area and is determined by a first shadow width of the functional layer extending from the display area to the non-display area, and the first shadow width is a maximum value of a width of a shadow area formed in a preset area under a condition that the functional layer is evaporated in the preset area.

In some embodiments, the mask plate assembly further comprising: a second mask plate for forming a pixel defining layer, wherein a size of an opening of the second mask plate is determined by the size of the display area, the first minimum distance, and a second minimum distance, the second minimum distance is a minimum distance between the boundary of the functional layer and a boundary of the pixel defining layer in a direction from the display area to the non-display area and is determined by a second shadow width of the functional layer, the pixel defining layer extends from the display area to the non-display area, and the of the second shadow width is a maximum value of a width of a shadow area formed outside the preset area under a condition that the functional layer is evaporated within the preset area.

In some embodiments, the mask plate assembly further comprising: a third mask plate for forming a cathode layer, wherein a size of the opening of the third mask plate is determined by the size of the display area, the first minimum distance, the second minimum distance, and a third minimum distance, the third minimum distance is a minimum distance between the boundary of the pixel defining layer and a boundary of the cathode layer in a direction from the display area to the non-display area and is determined by a preset minimum cathode lap width and a third shadow width of the cathode layer, the cathode layer extends from the display area to the non-display area, and the third shadow width is a minimum width of a shadow area formed outside the preset area under a condition that the cathode layer is evaporated in the preset area.

In some embodiments, the mask plate assembly further comprising: a fourth mask plate for forming a covering layer, wherein a size of an opening of the fourth mask plate is determined by the size of the display area, the first minimum distance, the second minimum distance, the third minimum distance and a fourth minimum distance, the fourth minimum distance is a minimum distance between the boundary of the cathode layer and a boundary of the covering layer in a direction from the display area to the non-display area and is determined by a fourth shadow width of the cathode layer and a fifth shadow width of the covering layer, the fourth shadow width is a maximum value of a width of a shadow area formed outside a preset area under a condition that the cathode layer is evaporated in the preset area, the covering layer extends from the display area to the non-display area, and the fifth shadow width is the minimum width of the shadow area formed outside the preset area under a condition that the covering layer is evaporated in the preset area.

In some embodiments, the first minimum distance is determined by a formula $d=\sqrt{a^2+b^2}+c$, a is an alignment accuracy, b is a position accuracy of a mask plate, c is the first shadow width, and d is the first minimum distance.

In some embodiments, the second minimum distance is determined by a formula $f=\sqrt{a^2+b^2}e$, a is an alignment accuracy, b is a position accuracy of a mask plate, e is the second shadow width, and f is the second minimum distance.

In some embodiments, the third minimum distance is determined by a formula $i=\sqrt{a^2+b^2}+g-h$, a is an alignment accuracy, b is a position accuracy of a mask plate, g is the preset minimum cathode lap width, h is the third shadow width, and i is the third minimum distance.

In some embodiments, the fourth minimum distance is determined by a formula $m=\sqrt{2a^2+2b^2}+j-k$, a is an alignment accuracy, b is a position accuracy of a mask plate, j is the fourth shadow width, k is the fifth shadow width, and m is the fourth minimum distance.

Other features of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which are incorporated in and constitute a part of this specification, illustrate embodiments of the disclosure and together with the description, serve to explain the principles of the disclosure.

The present disclosure may be more clearly understood from the following detailed description taken in conjunction with the accompanying drawings, in which.

Figure 1:
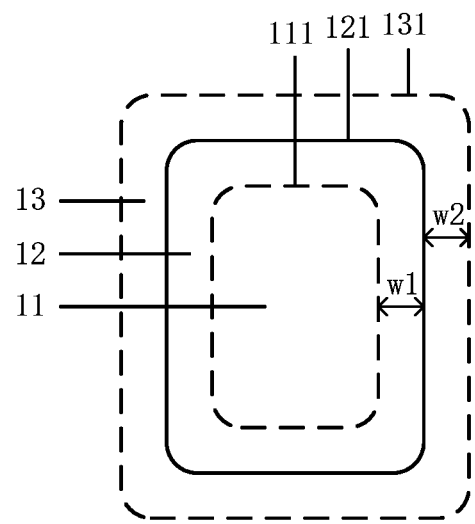
FIG. 1 is a schematic diagram illustrating the effect of evaporation according to one embodiment of the present disclosure.

It should be understood that the dimensions of the various parts shown in the drawings are not drawn according to the actual proportional relationship. Further, the same or similar reference signs denote the same or similar components.

DETAILED DESCRIPTION

Various exemplary embodiments of the present disclosure will now be described in detail with reference to the accompanying drawings. The description of the exemplary embodiments is merely illustrative and is in no way intended to limit the disclosure, its application, or uses. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps, the composition of materials and values set forth in these embodiments are to be construed as illustrative only and not as limiting unless otherwise specifically stated.

The use of "first", "second", and similar words in this disclosure is not intended to indicate any order, quantity, or importance, but rather is used to distinguish one element from another. The word "comprising" or "comprises", and the like, means that the element preceding the word comprises the element listed after the word, and does not exclude the possibility that other elements may also be included.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Techniques, methods, and apparatus known to one of ordinary skill in the relevant art may not be discussed in detail but are intended to be part of the specification where appropriate.

The inventors founded out through study that a substance evaporated from a evaporation source diffuses and deposits radially in a conical shape toward a substrate during a process of evaporating a material on the substrate, and a problem of uneven thickness of film layers formed on the substrate is likely to occur. An area of film layer with a thickness less than a preset threshold is referred to herein as a shadow area.

FIG. 1 is a schematic diagram illustrating the effect of evaporation according to one embodiment of the present disclosure.

As shown in FIG. 1, during the evaporation of the material onto a preset area of the substrate, a thickness of the film layer near a boundary 121 of the preset area tends to decrease. That is, the thickness of the film layer is less than the preset thickness in the vicinity of the boundary 121 of the preset area, thereby forming shadow areas in both the inside and the outside of the preset area.

Inside the preset area, besides the first area 11 where the thickness of the film layer reaches a preset thickness, there is also a first shadow area 12. The distance between the boundary 111 of the first area 11 and the boundary 121 of the preset area is taken as a shadow width w1 of the first shadow area 12. For example, the thickness of the film layer in the first shaded area 12 is less than 95% of the preset thickness.

Outside the boundary 121 of the preset area, there is also a second shadow area 13. The distance between the boundary 121 of the preset area and the boundary 131 of the second shadow area 13 is taken as a shadow width w2 of the second shadow area 13. For example, the thickness of the film layer in the second shadow area 13 is between 5% and 95% of the preset thickness.

The inventors founded that, during the process of evaporating the functional layer, the distance between the boundary of the AA (display) area and the boundary of the functional layer will be too small if the opening on the mask plate is too small, and the shadow area on the functional layer may cause abnormal display of pixels at the edge of the AA area. The distance between the boundary of the AA area and the boundary of the functional layer will be too large if the opening on the mask plate is too large, which is not favorable for designing an OLED device with a narrow frame.

Accordingly, the present discloses proposes the following scheme of manufacturing a display substrate, which can improve the display yield of the AA area while reducing the frame of the OLED equipment.

Figure 2:
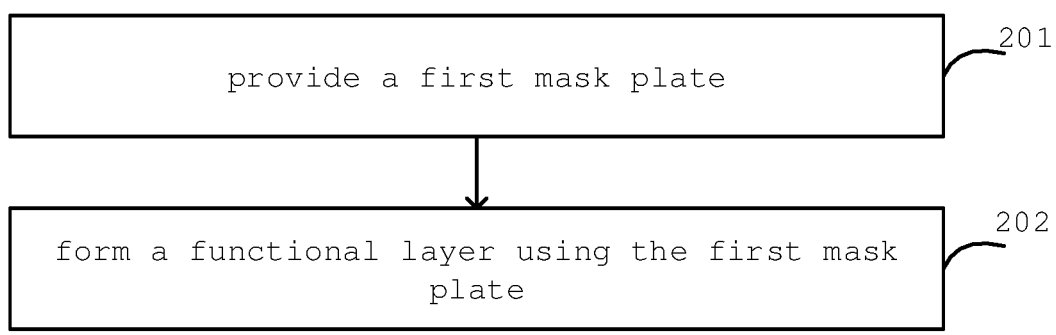
FIG. 2 is a schematic flow chart of a method of manufacturing a display substrate according to one embodiment of the present disclosure.

FIG. 2 is a schematic flow chart of a method of manufacturing a display substrate according to one embodiment of the present disclosure. The display substrate comprises a base substrate, and a pixel defining layer, a functional layer, a cathode layer and a covering layer which are sequentially stacked in a direction away from the base substrate.

In step 201, a first mask plate for forming a functional layer is provided.

A size of the orthographic projection of the functional layer on the base substrate is determined by a size of a display area and a first minimum distance. The first minimum distance is a minimum distance between a boundary of the display area and a boundary of the functional layer in a direction from the display area to a non-display area. The first minimum distance is determined by a first shadow width of the functional layer extending from the display area to the non-display area. The first shadow width is the maximum width of a shadow area formed in a preset area under a condition that a functional layer is evaporated in the preset area.

In some embodiments, the first minimum distance d is calculated using the following equation (1).

$$d = \sqrt{a^2 + b^2} + c \qquad (1)$$

In formula (1), a is an alignment accuracy of the equipment, b is a position accuracy of the mask plate, and c is the first shadow width.

In some embodiments, the functional Layer may be a HTL (Hole Transport Layer), an ETL (Electron Transport Layer), or other types of functional layers.

In step 202, a functional layer is formed using a first mask.

In some embodiments, the AA area is rectangular, corresponding to a length x and a width y. If the first minimum distance is d, the opening of the first mask plate for evaporating the functional layer is also rectangular, the corresponding opening length is at least x+2d, and the opening width is at least y+2d.

Figure 3:
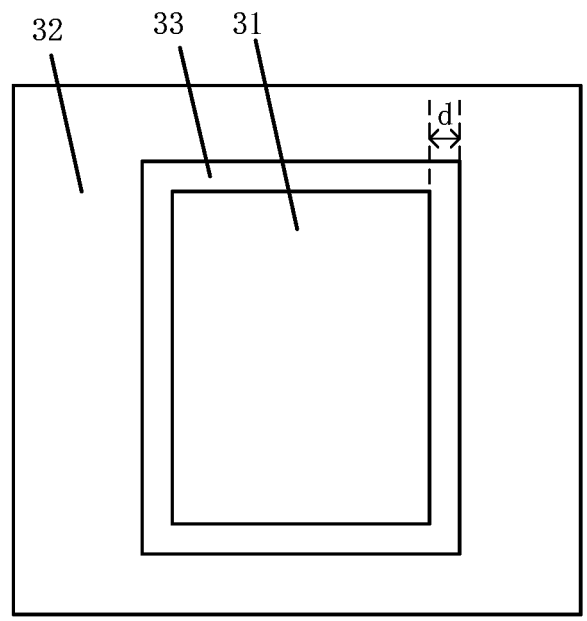
FIG. 3 is a schematic diagram of boundaries of film layers according to one embodiment of the present disclosure.

FIG. 3 is a schematic diagram of boundaries of film layers according to one embodiment of the present disclosure.

As shown in FIG. 3, a first minimum distance between a boundary of the display area 31 and a boundary of the functional layer 33 in a direction from the display area 31 to the non-display area 32 is d.

In the method for manufacturing a display substrate according to the embodiments of the present disclosure, by using the first mask, a distance between a boundary of the display area and a boundary of the functional layer in a direction from the display area to the non-display area is a first minimum distance, so that pixels at an edge of the AA area can be effectively prevented from being affected by a shadow area on the functional layer.

Figure 4:
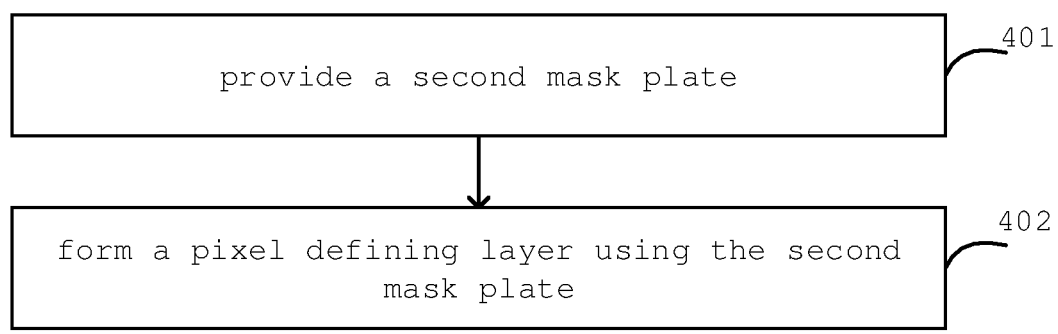
FIG. 4 is a schematic flow chart of a method of manufacturing a display substrate according to another embodiment of the present disclosure.

FIG. 4 is a schematic flow chart of a method of manufacturing a display substrate according to another embodiment of the present disclosure.

In step 401, a second mask plate for forming a pixel defining layer is provided.

A size of the orthographic projection of the pixel defining layer on the substrate is determined by the size of the display area, the first minimum distance and a second minimum distance. The first minimum distance is a minimum distance between the boundary of the display area and the boundary of the functional layer in a direction from the display area to the non-display area. The second minimum distance is a minimum distance between a boundary of the functional layer and a boundary of the pixel defining layer in a direction from the display area to the non-display area. The second minimum distance is determined by a second shadow width of the functional layer. The pixel defining layer extends from the display area to the non-display area, and the second shadow width is the maximum width of the shadow area formed outside the preset area under a condition that the functional layer is evaporated in the preset area.

In some embodiments, the first minimum distance is calculated using formula (1) mentioned above.

In some embodiments, the second minimum distance f is calculated using the following formula (2).

$$f = \sqrt{a^2 + b^2} + e \qquad (2)$$

In formula (2), a is an alignment accuracy of the equipment, b is a position accuracy of the mask plate, and e is the second shadow width.

In step 402, a pixel defining layer is formed using a second mask plate.

In some embodiments, the mask plate for fabricating the pixel defining layer is a photolithography mask plate, so that the pixel defining layer is formed on the designated film layer through photolithography, exposure, and other processes.

It should be noted that, if positive photoresist is used, the size of the opening of the photolithography mask plate is the size of the light-transmitting area of the photolithography mask plate. If a negative photoresist is used, the size of the opening of the photolithography mask plate is the size of the opaque area of the photolithography mask plate.

In some embodiments, the AA area is rectangular, of which the corresponding length is x and the corresponding width is y. If the first minimum distance is d and the second minimum distance is f, the opening of the second mask plate for forming the pixel defining layer is also rectangular, of which the corresponding length of the opening is at least x+2d+2f, and the width of the opening is at least y+2d+2f.

Figure 5:
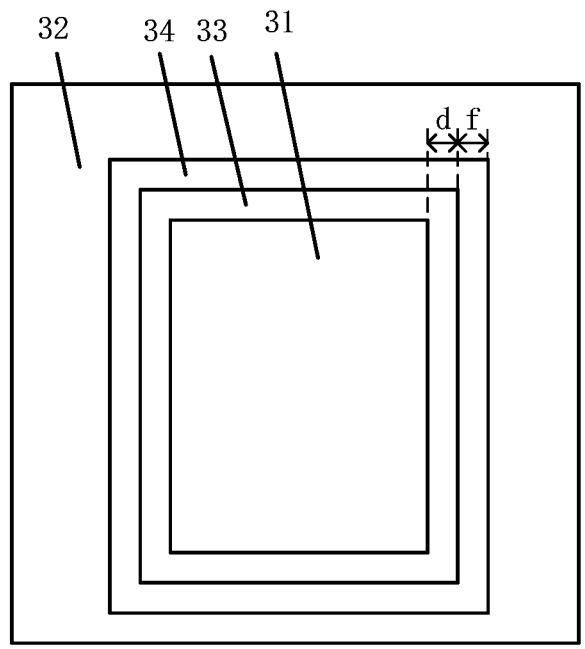
FIG. 5 is a schematic diagram of boundaries of film layers according to another embodiment of the present disclosure.

FIG. 5 is a schematic view of the boundaries of film layers according to another embodiment of the present disclosure.

As shown in FIG. 5, a second minimum distance between a boundary of the functional layer 33 and a boundary of the pixel defining layer 34 in the direction from the display area 31 to the non-display area 32 is f.

In the method for manufacturing a display substrate according to the embodiments of the present disclosure, by using the second mask, the distance between the boundary of the functional layer and the boundary of the pixel definition layer in the direction from the display area to the non-display area is the second minimum distance, so that the problem of non-uniform display brightness caused by the boundary of the functional layer exceeding the boundary of the pixel defining layer can be effectively avoided.

Figure 6:
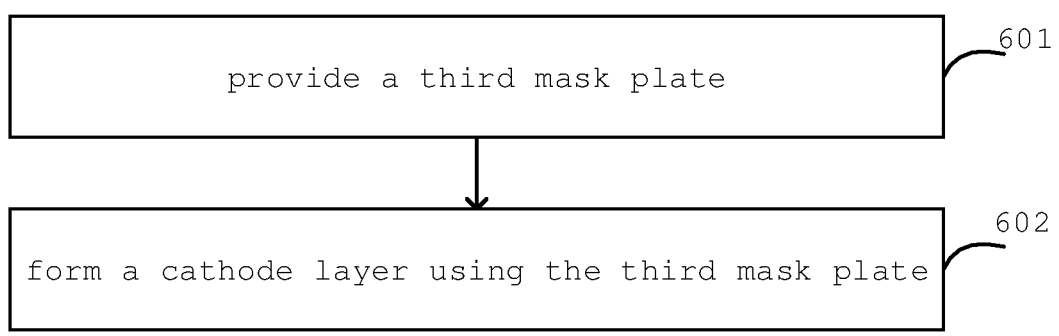
FIG. 6 is a schematic flow chart of a method of manufacturing a display substrate according to still another embodiment of the present disclosure.

FIG. 6 is a schematic flowchart of a method for manufacturing a display substrate according to still another embodiment of the present disclosure.

In step 601, a third mask plate for forming a cathode layer is provided.

A size of the orthographic projection of the cathode layer on the substrate is determined by the size of the display area, the first minimum distance, the second minimum distance and a third minimum distance. The first minimum distance is a minimum distance between a boundary of the display area and the boundary of the functional layer in a direction from the display area to the non-display area. The second minimum distance is a minimum distance between the boundary of the functional layer and the boundary of the pixel defining layer in a direction from the display area to the non-display area. The third minimum distance is a minimum distance between a boundary of the pixel defining layer and a boundary of the cathode layer in a direction from the display area to the non-display area. The third minimum distance is determined by a preset minimum cathode lap width and a third shadow width of the cathode layer. The cathode layer extends from the display area to the non-display area, and the third shadow width is the minimum width of the shadow area formed outside the preset area under a condition that the cathode layer is evaporated in the preset area. It should be noted that the preset minimum cathode lap width is a preset minimum distance between a boundary of the pixel defining layer and a boundary of the cathode layer in a direction from the display area to the non-display area. The lap here means that the cathode is lapped over an anode ITO (Indium-Tin Oxide) conductive film so as to connect the cathode to the ground terminal Vss.

In some embodiments, the difference between the preset minimum cathode lap width and the third shadow width is a first difference, and the third minimum distance is positively correlated to the first difference.

In some embodiments, the first minimum distance is calculated using formula (1) above and the second minimum distance is calculated using formula (2) mentioned above.

In some embodiments, the third minimum distance i is calculated using the following formula (3).

$$i = \sqrt{a^2 + b^2} + g - h \qquad (3)$$

In formula (3), a is an alignment accuracy of the equipment, b is a position accuracy of the mask plate, g is the preset minimum cathode lap width, and h is the third shadow width.

In step 602, a cathode layer is formed using a third mask.

In some embodiments, the AA area is rectangular, of which the corresponding length is x and the width is y. If the first minimum distance is d, the second minimum distance is f, and the third minimum distance is i, then the opening of the third mask plate for evaporating the cathode layer is also rectangular, of which the corresponding length of the opening is at least x+2d+2f+2i, and the width of the opening is at least y+2d+2f+2i.

Figure 7:
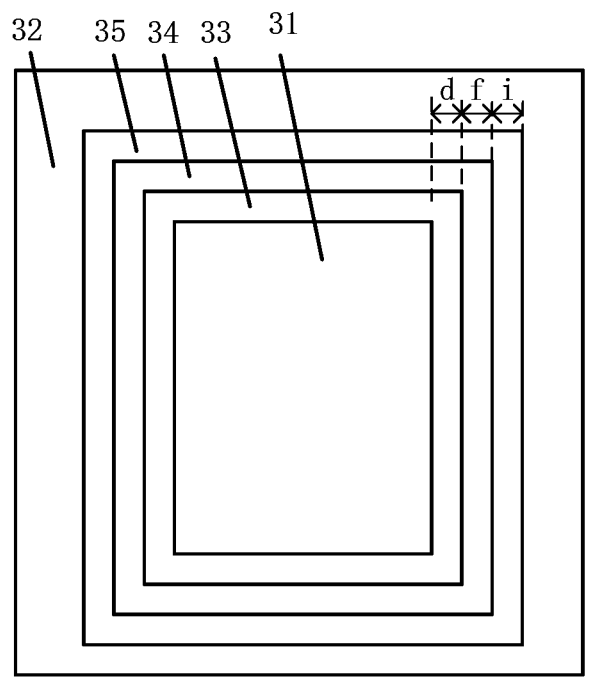
FIG. 7 is a schematic diagram of boundaries of film layers according to still another embodiment of the present disclosure.

FIG. 7 is a schematic diagram of the boundaries of film layers according to still another embodiment of the present disclosure.

As shown in FIG. 7, a third minimum distance between a boundary of the pixel defining layer 34 and a boundary of the cathode layer 35 in the direction from the display area 31 to the non-display area 32 is i.

In the method for manufacturing a display substrate according to the embodiments of the present disclosure, by using the third mask, the distance between the boundary of the pixel defining layer and the boundary of the cathode layer in the direction from the display area to the non-display area is the third minimum distance, so that the problem of display brightness reduction caused by too low lap width of the cathode can be effectively avoided.

Figure 8:
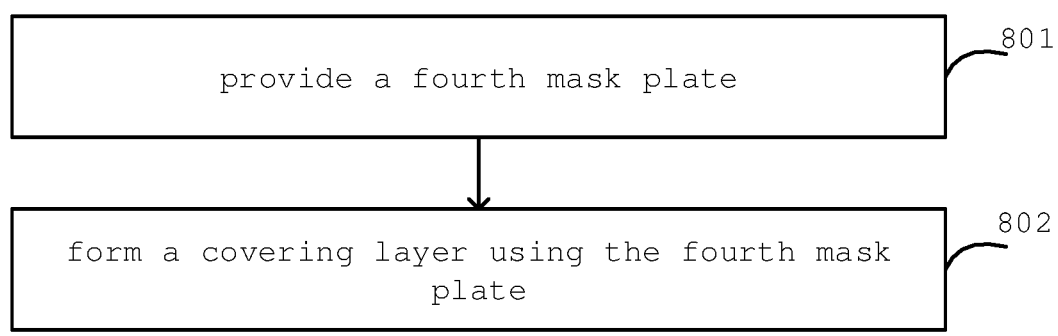
FIG. 8 is a schematic flow chart of a method of manufacturing a display substrate according to still another embodiment of the present disclosure.

FIG. 8 is a schematic flow chart of a method of manufacturing a display substrate according to still another embodiment of the present disclosure.

In step 801, a fourth mask plate for forming a covering layer is provided.

A size of the orthographic projection of the covering layer on the base substrate is determined by the size of the display area, the first minimum distance, the second minimum distance, the third minimum distance and a fourth minimum distance. The first minimum distance is a minimum distance between a boundary of the display area and a boundary of the functional layer in a direction from the display area to the non-display area. The second minimum distance is a minimum distance between a boundary of the functional layer and a boundary of the pixel defining layer in a direction from the display area to the non-display area. The third minimum distance is a minimum distance between a boundary of the pixel defining layer and a boundary of the cathode layer in a direction from the display area to the non-display area. The fourth minimum distance is a minimum distance between a boundary of the cathode layer and a boundary of the covering layer in a direction from the display area to the non-display area. The fourth minimum distance is determined by a fourth shadow width of the cathode layer and a fifth shadow width of the covering layer. The fourth shadow width is the maximum width of the shadow area formed outside the preset area under a condition that the cathode layer is evaporated in the preset area, and the covering layer extends from the display area to the non-display area. The fifth shadow width is the minimum width of the shadow area formed outside the preset area under a condition that the covering layer is evaporated in the preset area. In some embodiments, the difference between the fourth shadow width and the fifth shadow width is a second difference, and the fourth minimum distance is positively correlated with the second difference.

In some embodiments, the first minimum distance is calculated using formula (1) mentioned above, the second minimum distance is calculated using formula (2) mentioned above, and the third minimum distance is calculated using formula (3) mentioned above.

In some embodiments, the fourth minimum distance m is calculated using the following formula (4).

$$m = \sqrt{2a^2 + 2b^2} + j - k \quad (4)$$

In formula (4), a is an alignment accuracy of the equipment, b is a position accuracy of the mask plate, j is the fourth shadow width, and k is the fifth shadow width.

In step 802, a covering layer is formed using a fourth mask plate.

In some embodiments, the AA area is rectangular, of which the corresponding length is x and the width is y. If the first minimum distance is d, the second minimum distance is f, the third minimum distance is i, and the fourth minimum distance is m, then the opening of the fourth mask plate for evaporating the covering layer is also rectangular, the length of the corresponding opening is at least x+2d+2f+2i+2m, and the width of the opening is at least y+2d+2f+2i+2m.

Figure 9:
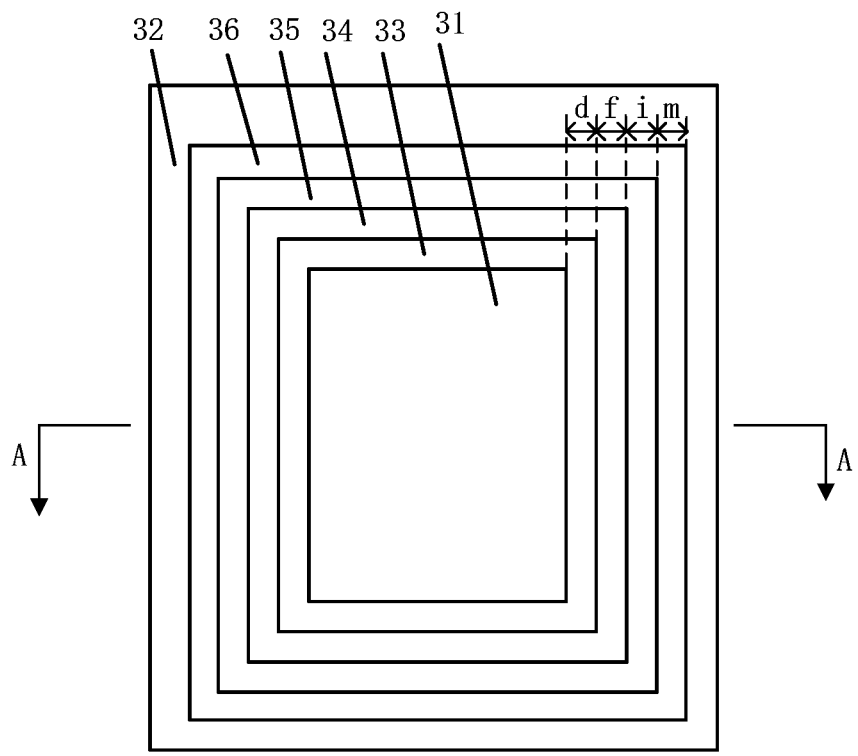
FIG. 9 is a schematic diagram of boundaries of film layers according to still another embodiment of the present disclosure.

FIG. 9 is a schematic view of the boundaries of film layers according to still another embodiment of the present disclosure.

As shown in FIG. 9, a fourth minimum distance between the boundary of the cathode layer 35 and the boundary of the covering layer 36 in the direction from the display area 31 to the non-display area 32 is m.

In the method for manufacturing a display substrate according to the embodiments of the present disclosure, by using the fourth mask plate, the distance between the boundary of the cathode layer and the boundary of the covering layer in the direction from the display area to the non-display area is the fourth minimum distance, so that a problem that moisture in the air and the cathode layer chemically react to generate black dots due to the fact that the boundary of the cathode layer exceeds the boundary of the covering layer can be effectively avoided.

It should be noted that, in the process of calculating the size of the mask, the order used is to calculate the mask plate for forming the functional layer, and then calculate the mask for forming the pixel defining layer, the mask plate for forming the cathode layer, and the mask plate for forming the covering layer. However, in the manufacturing process of the display substrate, the sequence adopted is to manufacture the pixel definition layer, then manufacture the functional layer above the pixel defining layer, then manufacture the cathode layer which covers the functional layer, and manufacture the covering layer that covers the cathode layer.

Figure 10:
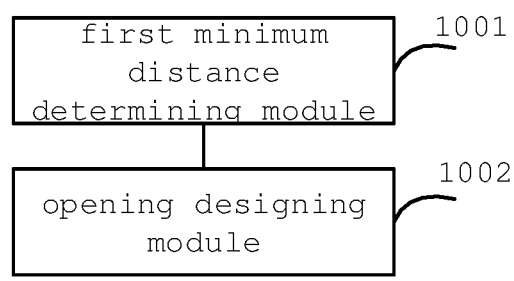
FIG. 10 is a schematic diagram of the structure of a mask plate assembly design apparatus according to one embodiment of the present disclosure.

FIG. 10 is a schematic structural diagram of a mask plate assembly designing apparatus according to an embodiment of the present disclosure. As shown in FIG. 10, the mask plate assembly designing apparatus includes a first minimum distance determining module 1001 and an opening designing module 1002.

The first minimum distance determining module 1001 determines a first minimum distance between a boundary of the display area and a boundary of the functional layer in a direction from the display area to the non-display area according to a first shadow width of the functional layer extending from the display area to the non-display area. The first shadow width is the maximum width of a shadow area formed in a preset area under a condition that a functional layer is evaporated in the preset area.

In some embodiments, the first minimum distance determining module 1001 calculates the first minimum distance d using formula (1) mentioned above.

In some embodiments, the functional layer may be an HTL layer, an ETL layer, or other types of functional layers.

The opening designing module 1002 determines the size of an opening of a mask plate for evaporating a functional layer according to the size of the display area and the first minimum distance.

In some embodiments, the AA area is rectangular. The corresponding length is x, and the width is y. If the first minimum distance is d, the opening of the mask plate for evaporating the functional layer is also rectangular. The corresponding length of the opening is at least x+2d, and the width of the opening is at least y+2d.

In the mask plate assembly designing apparatus provided in the above embodiments of the present disclosure, by determining the first minimum distance between the boundary of the display area and the boundary of the functional layer in the direction from the display area to the non-display area, the pixels at the edge of the AA area may be effectively prevented from being affected by the shadow area on the functional layer.

Figure 11:
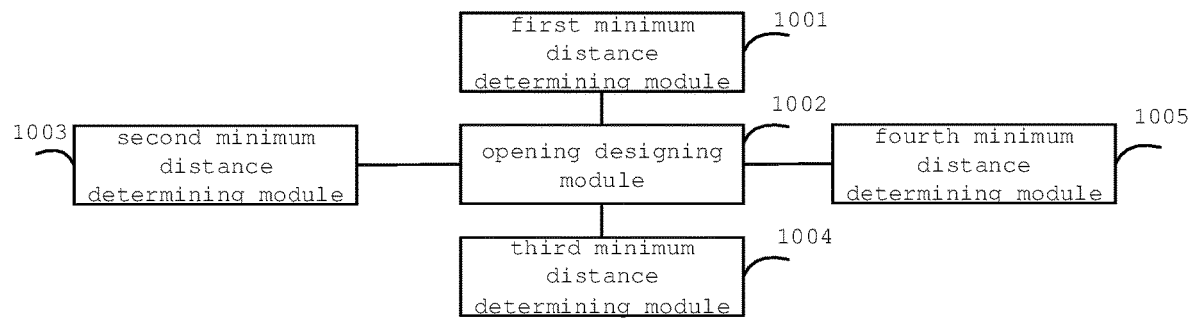
FIG. 11 is a schematic structural diagram of a mask plate assembly design apparatus according to another embodiment of the present disclosure.

FIG. 11 is a schematic structural diagram of a mask plate assembly designing apparatus according to another embodiment of the present disclosure. FIG. 11 differs from FIG. 10 in that, in the embodiment shown in FIG. 11, the mask plate assembly designing apparatus further includes a second minimum distance determining module 1003.

The second minimum distance determining module 1003 determines a second minimum distance between the boundary of the functional layer and the boundary of the pixel defining layer in a direction from the display area to the non-display area according to the second shadow width of the functional layer. The pixel defining layer extends from the display area to the non-display area, and the second is the maximum width of the shadow area formed outside the preset area under a condition that the functional layer is evaporated in the preset area.

In some embodiments, the second minimum distance f is calculated using formula (2) mentioned above.

The opening designing module 1002 determines the size of an opening of a mask plate for forming a pixel defining layer according to the size of the display area, the first minimum distance, and the second minimum distance.

In some embodiments, the AA area is rectangular. The corresponding length of the opening is x, and the width is y. If the first minimum distance is d and the second minimum distance is f, then the opening of the mask for forming the pixel defining layer is also rectangular. The corresponding length of the opening is at least x+2d+2f, and the width of the opening is at least y+2d+2f.

In the mask plate assembly designing apparatus provided in the above embodiment of the present disclosure, by determining the second minimum distance between the boundary of the functional layer and the boundary of the pixel defining layer in the direction from the display area to the non-display area, the problem of non-uniform display brightness due to the fact that the boundary of the functional layer exceeds the boundary of the pixel definition layer can be effectively avoided.

In some embodiments, as shown in FIG. 11, the mask plate assembly designing apparatus further comprises a third minimum distance determining module 1004.

The third minimum distance determining module 1004 determines a third minimum distance between the boundary of the pixel defining layer and the boundary of the cathode layer in a direction from the display area to the non-display area according to a preset minimum cathode lap width and a third shadow width of the cathode layer. The cathode layer extends from the display area to the non-display area, and the third shadow width is the minimum width of the shadow area formed outside the preset area under a condition that the cathode layer is evaporated in the preset area.

In some embodiments, the difference between the preset minimum cathode lap width and the third shadow width is a first difference, and the third minimum distance is positively correlated to the first difference.

In some embodiments, the third minimum distance i is calculated using formula (3) above.

The opening designing module 1002 determines the size of an opening of a mask plate for evaporating the cathode layer according to the size of the display area, the first minimum distance, the second minimum distance, and the third minimum distance.

In some embodiments, the AA area is rectangular. The corresponding length is x and the width is y. If the first minimum distance is d, the second minimum distance is f, and the third minimum distance is i, then the opening of the mask plate for evaporating the cathode layer is also rectangular. The corresponding length of the opening is at least x+2 d+2f+2i, and the width of the opening is at least y+2d+2f+2i.

In the mask assembly designing apparatus provided in the above embodiment of the present disclosure, by determining the third minimum distance between the boundary of the pixel defining layer and the boundary of the cathode layer in the direction from the display area to the non-display area, the problem of display brightness reduction caused by too low cathode lap width can be effectively avoided.

In some embodiments, as shown in FIG. 11, the mask plate assembly designing apparatus further comprises a fourth minimum distance determining module 1005.

The fourth minimum distance determining module 1005 determines a fourth minimum distance between the boundary of the cathode layer and the boundary of the covering layer in a direction from the display area to the non-display area according to a fourth shadow width of the cathode layer and a fifth shadow width of the covering layer. The fourth shadow width is the maximum width of the shadow area formed outside a preset area under a condition that the cathode layer is evaporated in the preset area. The covering layer extends from the display area to the non-display area. The fifth shadow width is the minimum width of the shadow area formed outside the preset under a condition that the covering layer is evaporated in the preset area.

In some embodiments, the difference between the fourth shadow width and the fifth shadow width is a second difference, and the fourth minimum distance is positively correlated with the second difference.

In some embodiments, the fourth minimum distance m is calculated using formula (4) mentioned above.

The opening designing module 1002 determines the size of an opening of a mask plate for evaporating a covering layer according to the size of the display area, the first minimum distance, the second minimum distance, the third minimum distance, and the fourth minimum distance.

In some embodiments, the AA area is rectangular. The corresponding length is x and the width is y. If the first minimum distance is d, the second minimum distance is f, the third minimum distance is i, and the fourth minimum distance is m, then the opening of the mask plate for evaporating the covering layer is also rectangular. The corresponding length of the opening is at least x+2d+2f+2i+2m, and the width of the opening is at least y+2d+2f+2i+2m.

In the mask assembly designing apparatus provided in the above embodiments of the present disclosure, by determining the fourth minimum distance between the boundary of the cathode layer and the boundary of the covering layer in the direction from the display area to the non-display area, the problem that the moisture in the air chemically reacts with the cathode layer to generate black dots due to the fact that the boundary of the cathode layer exceeds the boundary of the covering layer can be effectively avoided.

In some embodiments, the above-mentioned functional units and modules may be implemented as a general purpose processor, a programmable logic controller (PLC), a digital signal processor (DSP), an application specific integrated circuit (ASIC), a field-programmable gate array (FPGA) or other programmable logic device, discrete gate or transistor logic, discrete hardware components, or any suitable combination thereof for performing the functions described in the present disclosure.

Figure 12:
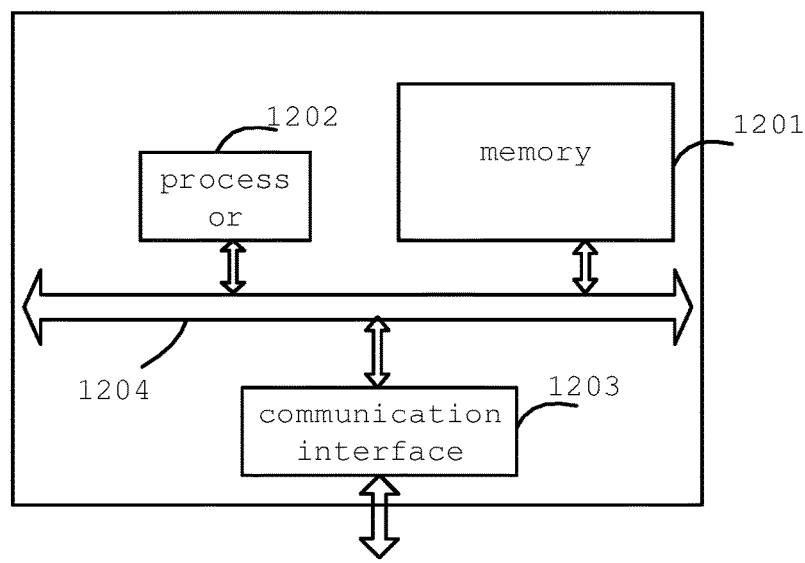
FIG. 12 is a schematic diagram of the structure of a mask plate assembly design apparatus according to still another embodiment of the present disclosure.

FIG. 12 is a schematic structural diagram of a mask plate assembly designing apparatus according to still another embodiment of the present disclosure. As shown in FIG. 12, the mask plate assembly designing apparatus includes a memory 1201 and a processor 1202.

The memory 1201 is used to store instructions. The processor 1202 is coupled to a memory 1201. The processor 1202 is configured to perform a method as directed to any of the embodiments of FIGS. 2, 4, 6, and 8 based on the memory stored instructions.

As shown in FIG. 12, the mask plate assembly designing apparatus further includes a communication interface 1203, which is used for information interaction with other devices. Meanwhile, the device also comprises a bus 1204, and the processor 1202, the communication interface 1203 and the memory 1201 are communicated with each other through the bus 1204.

The memory 1201 may include a random access memory (RAM) or a non-volatile memory (NVM), such as at least one disk storage. The memory 1201 may also be a memory array. The storage 1201 may also be partitioned, and the blocks may be combined into virtual volumes according to certain rules.

Further, processor 1202 may be a central processing unit, or may be an ASIC (Application Specific Integrated Circuit), or one or more integrated circuits configured to implement embodiments of the present disclosure.

The present disclosure also provides a computer-readable storage medium. The computer readable storage medium stores computer instructions, and when executed by the processor, the instructions implement the method according to any one of FIGS. 2, 4, 6 and 8.

The present disclosure also provides a display substrate. In some embodiments, a display substrate is fabricated using the method of FIGS. 2, 4, 6, and 8.

Figure 13:
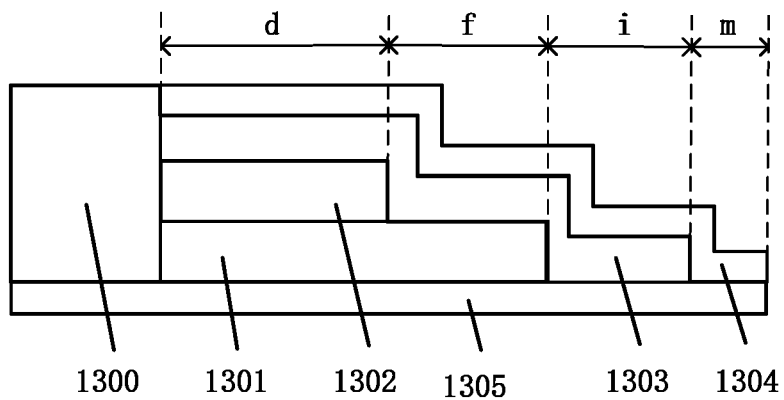
FIG. 13 is a schematic partial cross-sectional view of a display device according to one embodiment of the present disclosure.

FIG. 13 is a schematic partial cross-sectional view of a display device according to one embodiment of the present disclosure. FIG. 13 is a cross-sectional view taken along line A-A of FIG. 9.

As shown in FIG. 13, evaporation is first performed using a mask plate for forming a pixel defining layer to form a pixel defining layer 1301 on a base substrate 1305. The minimum distance between the boundary of the display area 1300 and the boundary of the pixel defining layer 1301 in the direction from the display area to the non-display area is d+f. For example, d is determined by using the above formula (1), and f is determined by using the above formula (2).

Next, evaporation is performed using a mask plate for evaporation of the HTL layer, so that an HTL layer 1302 is formed on the pixel defining layer 1301. The minimum distance between the boundary of the display area 1300 and the boundary of the HTL layer 1302 in the direction from the display area to the non-display area is d.

Next, evaporation is performed using a mask plate for evaporation of a cathode layer, so that a cathode layer 1303 covering the HTL layer 1302 and the pixel defining layer 1301 is formed. The minimum distance between the boundary of the pixel definition layer 1301 and the boundary of the cathode layer 1303 in the direction from the display area to the non-display area is i which, for example, is determined by using the above formula (3).

Finally, evaporation is performed by using a mask plate of an evaporation covering layer, so as to form a covering layer 1304 covering the cathode layer 1303. The minimum distance between the boundary of the cathode layer 1303 and the boundary of the covering layer 1304 in the direction from the display area to the non-display area is m. For example, m is determined by using the above formula (4).

It should be noted here that, for the sake of simplicity, only the film layer structure on the right side of the display area is shown in FIG. 13. In practice, there is also a corresponding film structure on the left side of the display area. The film layer structures on the left and right sides of the display area are symmetrically arranged with respect to the display area.

Figure 14:
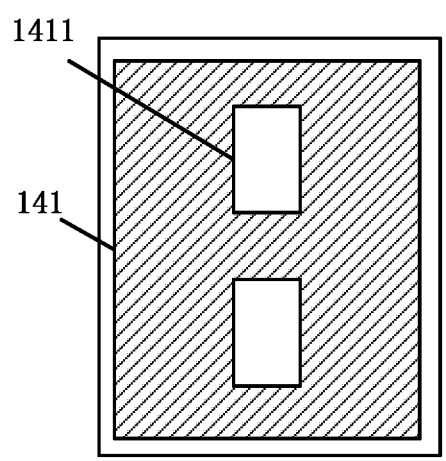
FIG. 14 is a schematic structural view of a mask plate assembly according to one embodiment of the present disclosure.

FIG. 14 is a schematic structural diagram of a mask plate assembly according to an embodiment of the present disclosure.

As shown in FIG. 14, the mask plate assembly includes a first mask plate 141.

The first mask plate 141 has an opening 1411 for forming a functional layer. The size of the opening 1411 of the first mask 141 is determined by the size of the display area and the first minimum distance. The first minimum distance is a minimum distance between the boundary of the display area and the boundary of the functional layer in a direction from the display area to the non-display area. The first minimum distance is determined by a first shadow width of the functional layer extending from the display area to the non-display area, and the first shadow width is the maximum width of a shadow area formed in a preset area under a condition that the functional layer is evaporated in the preset area.

In some embodiments, the first minimum distance is calculated using formula (1) mentioned above.

In some embodiments, the AA area is rectangular. The corresponding length is x and the width is y. If the first minimum distance is d, the opening 1411 of the first mask plate 141 is also rectangular. The corresponding length of the opening is at least x+2d, and the width of the opening is at least y+2d.

Figure 15:
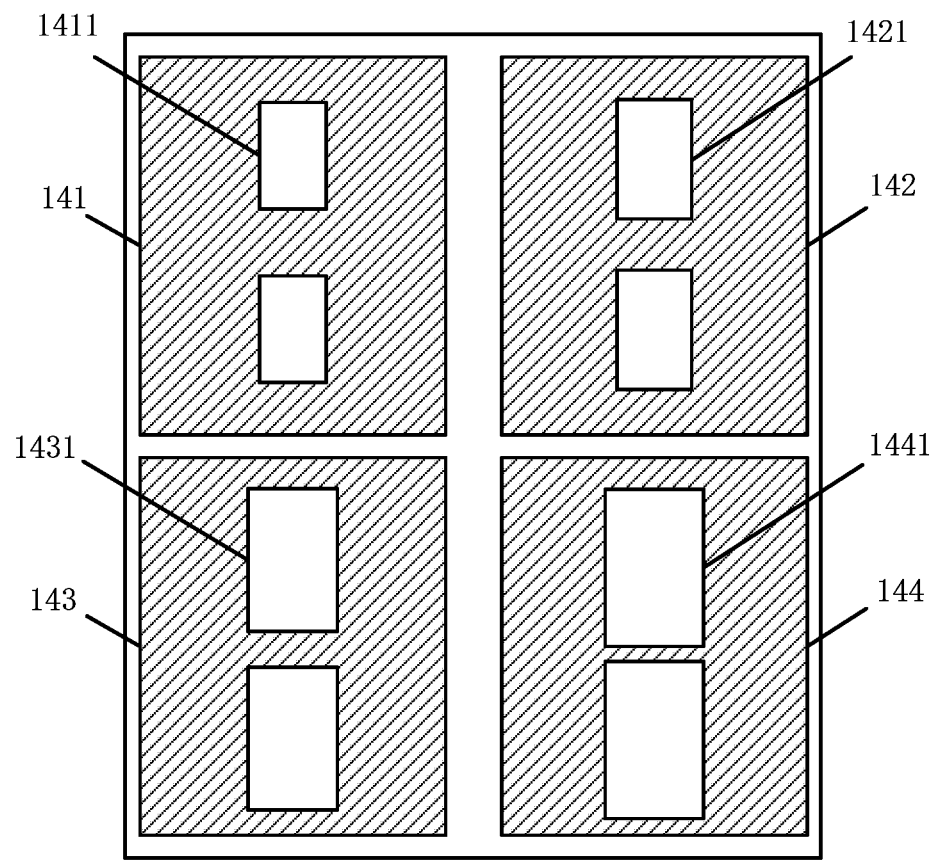
FIG. 15 is a schematic structural diagram of a mask plate assembly according to another embodiment of the present disclosure.

FIG. 15 is a schematic structural diagram of a mask plate assembly according to another embodiment of the present disclosure. FIG. 15 differs from FIG. 14 in that in the embodiment shown in FIG. 15, the mask plate assembly further includes a mask plate 142.

The mask plate 142 has an opening 1421 for forming a pixel defining layer. The size of the opening 1421 of the second mask plate 142 is determined by the size of the display area, the first minimum distance, and the second minimum distance. The first minimum distance is a minimum distance between the boundary of the display area and the boundary of the functional layer in a direction from the display area to the non-display area. The second minimum distance is a minimum distance between the boundary of the functional layer and the boundary of the pixel defining layer in a direction from the display area to the non-display area. The second minimum distance is determined by a second shadow width of the functional layer. The pixel defining layer extends from the display area to the non-display area, and the second shadow width is the maximum width of the shadow area formed outside a preset area under a condition that the functional layer is evaporated in the preset area.

In some embodiments, the second minimum distance is calculated using formula (2) mentioned above.

In an embodiment, the AA area is rectangular. The corresponding length is x and the width is y. If the first minimum distance is d and the second minimum distance is f, the opening 1421 of the second mask 142 is also rectangular. The corresponding opening length is at least x+2d+2f, and the opening width is at least y+2d+2f.

In some embodiments, as shown in FIG. 5, the mask plate assembly further includes a third mask plate 143. The third mask plate 143 has an opening 1431 for forming a cathode layer. The size of the opening 1431 of the third mask plate 143 is determined by the size of the display area, the first minimum distance, the second minimum distance, and the third minimum distance. The first minimum distance is a minimum distance between the boundary of the display area and the boundary of the functional layer in a direction from the display area to the non-display area. The second minimum distance is a minimum distance between the boundary of the functional layer and the boundary of the pixel defining layer in a direction from the display area to the non-display area. The third minimum distance is a minimum distance between the boundary of the pixel defining layer and the boundary of the cathode layer in a direction from the display area to the non-display area. The third minimum distance is determined by a preset minimum cathode lap width and a third shadow width of the cathode layer. The cathode layer extends from the display area to the non-display area. The third shadow width is the minimum width of the shadow area formed outside a preset area under a condition that the cathode layer is evaporated in the preset area.

In some embodiments, the third minimum distance is calculated using formula (3) mentioned above.

In some embodiments, the AA area is rectangular, corresponding to a length x and a width y. If the first minimum distance is d, the second minimum distance is f, and the third minimum distance is i, the opening 1431 of the third mask plate 143 is also rectangular, and the corresponding length of the opening is at least x+2d+2f+2i, and the width of the opening is at least y+2d+2f+2i.

In some embodiments, as shown in FIG. 5, the mask plate assembly further includes a fourth mask plate 144. The fourth mask plate 144 has an opening 1441 for forming a covering layer. The size of the opening 1441 of the fourth mask plate 144 is determined by the size of the display area, the first minimum distance, the second minimum distance, the third minimum distance, and the fourth minimum distance. The first minimum distance is a minimum distance between the boundary of the display area and the boundary of the functional layer in a direction from the display area to the non-display area. The second minimum distance is a minimum distance between the boundary of the functional layer and the boundary of the pixel defining layer in a direction from the display area to the non-display area. The third minimum distance is a minimum distance between the boundary of the pixel defining layer and the boundary of the cathode layer in a direction from the display area to the non-display area. The fourth minimum distance is a minimum distance between the boundary of the cathode layer and the boundary of the covering layer in a direction from the display area to the non-display area. The fourth minimum distance is determined by a fourth shadow width of the cathode layer and a fifth shadow width of the covering layer. The fourth shadow width is the maximum width of the shadow area formed outside a preset area under a condition that the cathode layer is evaporated in the preset area. The covering layer extends from the display area to the non-display area. The fifth shadow width is the minimum width of the shadow area formed outside the preset area under a condition that the covering layer is evaporated in the preset area.

In some embodiments, the fourth minimum distance is calculated using formula (4) mentioned above.

In some embodiments, the AA area is rectangular, corresponding to a length x and a width y. If the first minimum distance is d, the second minimum distance is f, the third minimum distance is i, and the fourth minimum distance is m, the opening 1441 of the fourth mask 144 is also rectangular, the corresponding length of the opening is at least x+2d+2f+2i+2m, and the width of the opening is at least y+2d+2f+2i+2m.

It should be noted that, in order to express the size of the opening of the mask in the non-display area, the opening of the mask in the corresponding display area is not shown in the mask shown in FIG. 14.

So far, embodiments of the present disclosure have been described in detail. Some details well known in the art have not been described in order to avoid obscuring the concepts of the present disclosure. Those skilled in the art can now fully appreciate how to implement the teachings disclosed herein, in view of the foregoing description.

Although some specific embodiments of the present disclosure have been described in detail by way of example, it should be understood by those skilled in the art that the above examples are for illustration only and are not intended to limit the scope of the present disclosure. It will be understood by those skilled in the art that various changes may be made and equivalents may be substituted for elements thereof without departing from the scope and spirit of the present disclosure. The scope of the present disclosure is defined by the appended claims.

What is claimed is:

1. A display substrate, comprising:
a base substrate; and
a pixel defining layer, a functional layer, a cathode layer and a covering layer which are sequentially stacked in a direction away from the base substrate,
wherein a size of the orthographic projection of the functional layer on the base substrate is determined by a size of a display area and a first minimum distance, the first minimum distance is a minimum distance between a boundary of the display area and a boundary of the functional layer in a direction from the display area to a non-display area and is determined by a first shadow width of the functional layer extending from the display area to the non-display area, and the first shadow width is a maximum value of a width of a shadow area of the functional layer in a preset area,
wherein the first minimum distance is determined by a formula $d=\sqrt{a^2+b^2}+c$, a is an alignment accuracy, b is a position accuracy of a mask plate, c is the first shadow width, and d is the first minimum distance, thereby preventing pixels at an edge of the display area from being affected by the shadow area on the functional layer,
wherein a size of an orthogonal projection of the pixel defining layer on the base substrate is determined by the size of the display area, the first minimum distance and a second minimum distance, the second minimum distance is a minimum distance between the boundary of the functional layer and a boundary of the pixel defining layer in a direction from the display area to the non-display area and is determined by a second shadow width of the functional layer, the pixel defining layer extends from the display area to the non-display area, and the second shadow width is a maximum value of a width of a shadow area of the functional layer outside the preset area, and
wherein the second minimum distance is determined by a formula $f=\sqrt{a^2+b^2}+e$, a is an alignment accuracy, b is a position accuracy of a mask plate, e is the second shadow width, and f is the second minimum distance, thereby avoiding a non-uniform display brightness caused by the boundary of the functional layer exceeding the boundary of the pixel defining layer.

2. The display substrate of claim 1, wherein the functional layer is a hole transport layer.

3. The display substrate of claim 1, wherein a size of an orthographic projection of the cathode layer on the base substrate is determined by the size of the display area, the first minimum distance, the second minimum distance and a third minimum distance, the third minimum distance is a minimum distance between the boundary of the pixel defining layer and a boundary of the cathode layer in a direction from the display area to the non-display area and is determined by a preset minimum cathode lap width and a third shadow width of the cathode layer, the cathode layer extends from the display area to the non-display area, and the third shadow width is a minimum width of a shadow area of the cathode layer outside the preset area.

4. The display substrate of claim 3, wherein the third minimum distance is positively correlated with a first difference, the first difference is a difference between the preset minimum cathode lap width and the third shadow width.

5. The display substrate of claim 4, wherein the third minimum distance is determined by a formula $i=\sqrt{a^2+b^2}+g-h$, a is an alignment accuracy, b is a position accuracy of a mask plate, g is the preset minimum cathode lap width, h is the third shadow width, and i is the third minimum distance.

6. The display substrate of claim 3, wherein a size of an orthographic projection of the covering layer on the base substrate is determined by the size of the display area, the first minimum distance, the second minimum distance, the third minimum distance and a fourth minimum distance, the fourth minimum distance is a minimum distance between the boundary of the cathode layer and a boundary of the covering layer in a direction from the display area to the non-display area and is determined by a fourth shadow width of the cathode layer and a fifth shadow width of the covering layer, the fourth shadow width is a maximum value of a width of a shadow area of the cathode layer outside the preset area, the covering layer extends from the display area to the non-display area, and the fifth shadow width is the minimum width of the shadow area of the covering layer outside the preset area.

7. The display substrate of claim 6, wherein the fourth minimum distance is positively correlated with a second difference, the second difference is a difference between the fourth shadow width and the fifth shadow width.

8. The display substrate of claim 7, wherein the fourth minimum distance is determined by a formula $m=\sqrt{2a^2+2b^2}+j-k$, a is an alignment accuracy, b is a position accuracy of a mask plate, j is the fourth shadow width, k is the fifth shadow width, and m is the fourth minimum distance.

* * * * *